United States Patent [19]
Brown

[11] Patent Number: 5,884,233
[45] Date of Patent: Mar. 16, 1999

[54] SYSTEM FOR REPORTING COMPUTER ENERGY CONSUMPTION

[75] Inventor: Alan E. Brown, Georgetown, Tex.

[73] Assignee: Dell USA, L.P., Round Rock, Tex.

[21] Appl. No.: 915,021

[22] Filed: Aug. 20, 1997

Related U.S. Application Data

[63] Continuation of Ser. No. 591,782, Jan. 25, 1996, Pat. No. 5,726,901.

[51] Int. Cl.$^6$ .................................................. G01R 21/06
[52] U.S. Cl. ............................... 702/61; 702/60; 702/64; 364/528.26; 395/750.08
[58] Field of Search .................................. 364/483, 481, 364/480, 486, 550, 551.01, 492, 493, 707, 829–831, 835, 841, 857, 528.21, 528.3, 528.26–528.29, 528.32; 363/95–98; 324/76.17, 59, 134, 137, 140 R, 141, 172; 361/28, 30, 65, 78, 79; 318/650, 455; 323/222, 274, 279, 280, 283–285, 289, 902; 395/750.01, 750.03, 750.04, 750.08; 307/50, 326, 99, 116, 117, 126, 140; 315/209 R, 211–214; 702/76, 60–62, 64, 65, 182, 183, 186, 189

[56] References Cited

U.S. PATENT DOCUMENTS

| | | | |
|---|---|---|---|
| 4,156,283 | 5/1979 | Gilbert | 364/857 |
| 4,663,587 | 5/1987 | Machenzie | 324/141 |
| 4,859,937 | 8/1989 | Mikovic | 324/142 |
| 4,924,412 | 5/1990 | Leydier | 364/483 |
| 4,928,038 | 5/1990 | Nerone | 315/209 R |
| 5,325,051 | 6/1994 | Germer et al. | 364/483 |
| 5,499,184 | 3/1996 | Squibb | 363/95 |
| 5,610,453 | 3/1997 | Smith | 307/116 |
| 5,636,109 | 6/1997 | Carroll | 363/21 |
| 5,726,901 | 3/1998 | Brown | 364/483 |

*Primary Examiner*—Hal Dodge Wachsman
*Attorney, Agent, or Firm*—Haynes and Boone, LLP

[57] ABSTRACT

A circuit for determining and reporting the energy consumed by an electronic device having a microprocessor and power supply lines for supplying power to the device is disclosed. The circuit comprises a voltage divider connected for sensing the voltage across the power supply lines and generating a voltage signal indicative of the sensed voltage. A current sense resistor is connected in series with a power supply line for sensing the current passing through the power supply lines and generating a current signal indicative of the sensed current. An analog multiplier is connected for receiving and computing the product of the voltage and current signals, and for generating a power signal indicative of the product of the voltage and current signals, the power signal being indicative of the power consumed by the device. A proportional voltage-to-frequency converter is connected for receiving the power signal and for generating primary signal pulses at a frequency proportional to the voltage level of the power signal, each of which pulses is indicative that a predetermined quantity of energy has been consumed by the device. An opto-coupler, connected to the converter, is responsive to generation of the primary signal pulse for reporting to the microprocessor a secondary signal pulse indicating that a predetermined quantity of energy has been consumed by the device.

5 Claims, 2 Drawing Sheets

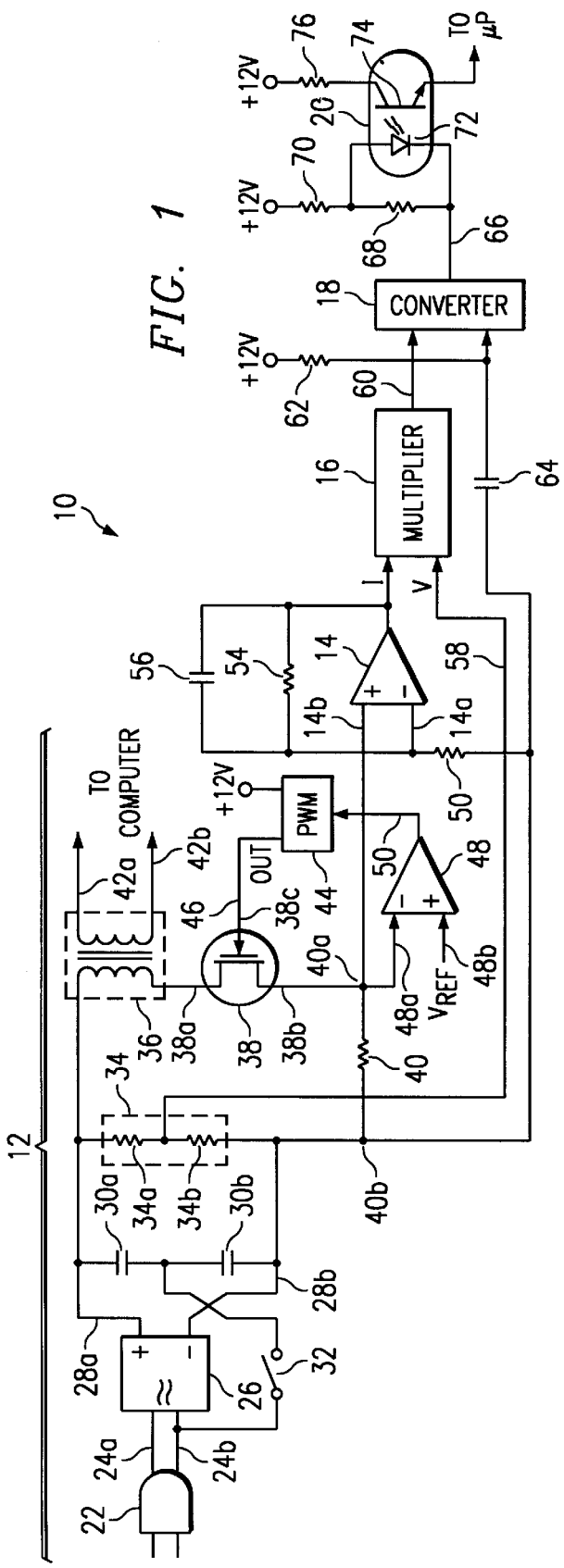
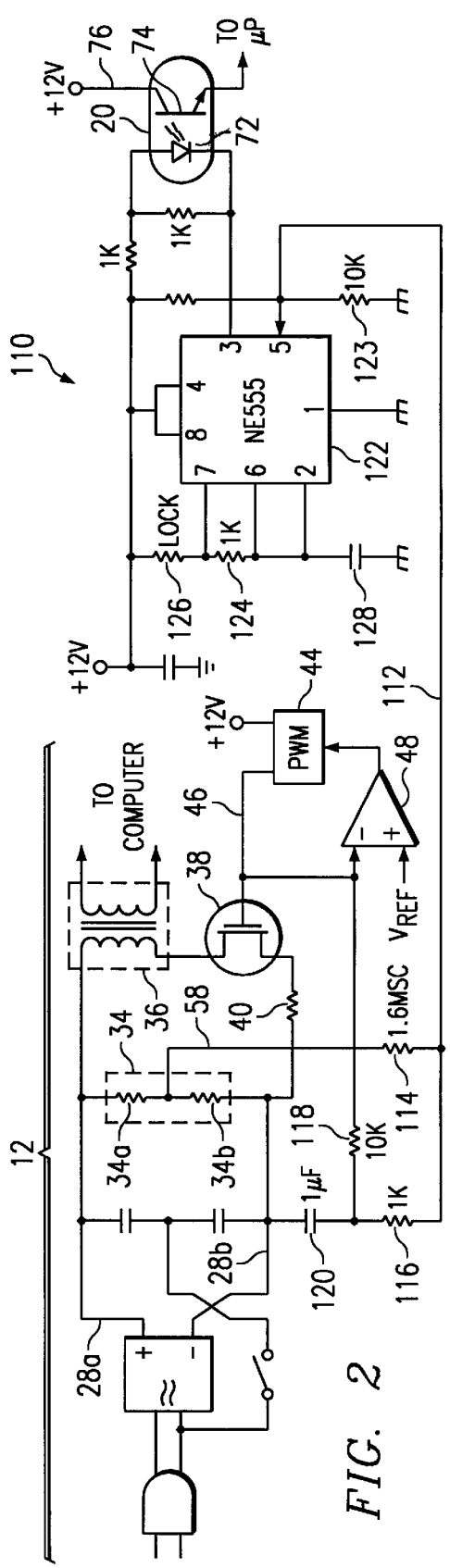
FIG. 1
FIG. 2

SYSTEM FOR REPORTING COMPUTER ENERGY CONSUMPTION

This application is a continuation of U.S. patent application Ser. No. 08/591,782, now U.S. Pat. No. 5,726,901, filed Jan. 25, 1996.

TECHNICAL FIELD

The invention relates generally to a system for measuring and reporting consumed energy and, more particularly, to a system for measuring and reporting energy consumed by a computer system.

BACKGROUND OF THE INVENTION

The power supply circuit of a computer system provides usable power to the electrical components and devices of the computer. Because most computers require voltage and current different from that generated and supplied by local utility companies, the computer's power supply must convert the incoming voltage and current to a form appropriate for use by the computer. For example, most utility companies in the United States produce power at 120 volts, as 60 hertz, sinusoidal alternating current (AC). A computer system, however, typically requires direct current (DC) power at a voltage level significantly lower than 120 volts, such as 12 volts or less. Hence, the computer's power supply converts "utility power" into "computer power."

As computer technology has progressed, computers have become more "powerful" and, as a consequence, require more electrical power, and are therefore more costly to operate than earlier computers. The impact of increasing operating costs of computers is particularly acute in large organizations having networks comprising a large number of computers. It is therefore desirable that computers be operated efficiently and economically so that operating costs are minimized. To this end, some computers are provided with power supplies having support circuitry that measures power consumed on the primary side of a power supply transformer and reports the measurements as a serial bit stream of data to a computer microprocessor on the secondary side of the transformer. Such support circuitry, however, comprises a relatively expensive microcontroller and, as a consequence, is relatively expensive to implement. It can be appreciated that the savings in operating costs made possible by such support circuitry are, to a certain extent, offset by the cost of the microcontroller required to achieve the savings, thereby defeating the purpose of the microcontroller.

Therefore, what is needed is a low cost (i.e., a non-microcontroller) system for measuring the amount of power, or energy, consumed by a computer on the primary side of the PC transformer and for generating to the secondary side thereof data indicative of the power measured.

SUMMARY OF THE INVENTION

The present invention, accordingly, provides, in a computer system having a microprocessor and power supply lines for supplying power to the computer system, a circuit for determining and reporting the energy consumed by the system. The circuit comprises a voltage divider connected for sensing the voltage across the power supply lines and generating a voltage signal indicative of the sensed voltage. A current sense resistor is connected in series with one of the power supply lines for sensing the current passing through the power supply lines and generating a current signal indicative of the sensed current. An analog multiplier is connected for receiving and computing the product of the voltage and current signals, and for generating a power signal indicative of the product of the voltage and current signals, the power signal being indicative of the power consumed by the computer. A proportional voltage-to-frequency converter is connected for receiving the power signal and for generating primary signal pulses at a frequency proportional to the voltage level of the power signal, each of which pulses is indicative that a predetermined quantity of energy has been consumed by the computer system. An opto-coupler, connected to the converter, is responsive to generation of the primary signal pulse for reporting to the microprocessor a secondary signal pulse indicating that a specific quantity of energy has been consumed by the computer system.

In another embodiment of the invention, the computer system is connected for receiving power from a switching power supply controlled by the pulse width of pulses output at a substantially constant frequency by a pulse width modulator (PWM), which power supply receives power through power supply lines. A circuit for determining and reporting the energy consumed by the system comprises a voltage divider connected for sensing the voltage across the power supply lines and supplying a voltage signal indicative of the sensed voltage. A line is connected to the output of the PWM for sensing the width of pulses output therefrom and for supplying a current signal from the sensed pulse widths indicative of current passing through the power supply lines. A timer device includes a capacitor that is charged at a rate proportional to the voltage level of the current and voltage signals until a first predetermined charge level is attained, at which point the capacitor is discharged to generates a primary energy pulse signal until a second predetermined charge level is attained, such that the primary energy pulse signal is generated at a frequency proportional to the received voltage and current signals, wherein each primary signal pulse represents a specific quantity of energy. An opto-coupler responsive to generation of the primary signal pulse reports to the microprocessor a secondary signal pulse indicating that a specific quantity of energy has been consumed.

A technical advantage achieved with the present invention is that it enables readily available, relatively inexpensive components to be utilized to measure the amount of energy consumed on the primary side of a transformer and to generate a signal to the secondary side indicative of the energy measured. Therefore, the cost of implementing the present invention is significantly less than a system which requires a microcontroller.

BRIEF DESCRIPTION OF THE DRAWINGS

FIG. 1 is a schematic diagram of a first embodiment of an energy reporting system embodying features of the present invention.

FIG. 2 is a schematic diagram of a second embodiment of an energy reporting system embodying features of the present invention.

DESCRIPTION OF THE PREFERRED EMBODIMENTS

Figure 3:
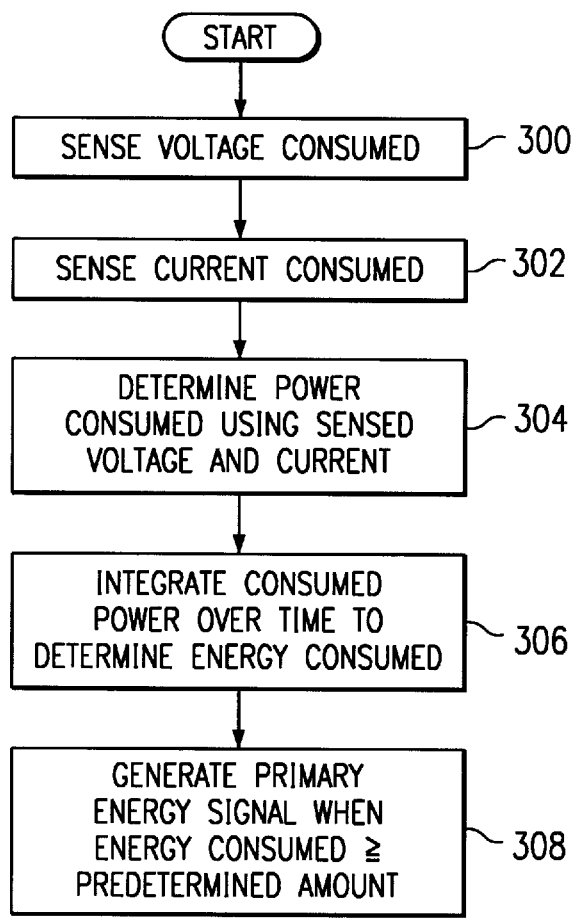
FIG. 3 is a flowchart of a method of determining and reporting consumed power embodying features of the present invention.

Referring to FIG. 1 of the drawings, the reference numeral 10 refers, in general, to a system for supplying energy to a computer (not shown), and for measuring and reporting the energy consumed by the computer. The system 10 comprises a conventional switching power supply 12 and, electrically connected thereto, a conventional operational amplifier ("op amp") 14, an analog multiplier 16, a proportional voltage-to-frequency converter 18, and an opto-coupler 20.

Because the power supply 12 is well known to those skilled in the art, it will not be described in detail. Accordingly, the power supply 12 includes a plug 22 for insertion into a conventional wall outlet (not shown) supplying either 110 volts or 220 volts of alternating current (AC). The power received through the plug 22 is then transmitted through two lines 24a and 24b to a conventional rectifier and filter circuit 26 which outputs direct current (DC) onto two power supply lines 28a and 28b of positive and negative polarities, respectively. Two serially connected bulk capacitors 30a and 30b are connected across the lines 28a and 28b and a switch 32 is connected from the line 24b to a midpoint between the bulk capacitors, thereby providing for the switchable conversion of 220 volts to 110 volts of power. A voltage divider 34 comprising two serially connected resistors 34a and 34b connected across the lines 28a and 28b, in parallel with the bulk capacitors 30a and 30b, is provided for purposes described below.

As depicted in FIG. 1, a transformer 36 is connected between the line 28a and a drain 38a of a conventional high voltage field effect transistor (FET) 38. A source 38b of the FET 38 is connected to a first end 40a of a current sense resistor 40 of low resistance, such as 1Ω or less, for sensing the current flowing through the power supply 12. A second end 40b of the resistor 40 is connected to the line 28b. The transformer 36, FET 38, and resistor 40 are thus serially connected across the lines 28a and 28b, in parallel with the bulk capacitors 30a and 30b and the resistors 34a and 34b. The transformer 36 is connected for delivering onto two lines 42a and 42b AC power which, it is understood, is then rectified, filtered, and passed to components (not shown) of a computer system for use therein. It is further understood that the transformer 36 generally defines a primary side comprising components electrically connected to the lines 28a and 28b, and a secondary side comprising components, namely computer components, electrically connected to the lines 42a and 42b.

A pulse width modulator (PWM) 44 is provided having a signal output line 46 connected to a gate 38c of the FET 38 for driving the FET and, thereby, for switching the current passing through the transformer 36 on and off. The PWM 44 is connected for receiving +12 volts $V_{CC}$ from the primary side of the transformer 36.

A conventional operational amplifier (op amp) 48 comprises an inverting input terminal 48a connected to the source 38b of the FET 38, and a noninverting input terminal 48b connected to a reference voltage, $V_{REF}$, of, for example, 1 volt. An output terminal 48c is connected for outputting a control signal generated by the op amp 48 to the PWM 44.

With reference to the op amp 14, an inverting input terminal 14a thereof is connected via a resistor 50 to the line 28b, and via a parallel connected resistor 54 and capacitor 56 for receiving feedback from an output terminal 14c of the op amp 14. A noninverting input terminal 14b of the op amp 14 is connected to the first end 40a of the current sense resistor 40 for sensing the current flowing therethrough. It can be appreciated that the output of the op amp 14 is a "current signal," the voltage level of which is directly proportional to the current passing through the primary side of the transformer 36.

The analog multiplier 16 is connected for receiving the current signal output from the output terminal 14c of the op amp 14. The multiplier 16 is also connected via a line 58 for receiving a "voltage signal" from the voltage divider 34, the voltage level of which signal is directly proportional to the voltage potential across the lines 28a and 28b.

The multiplier 16 is of conventional design and may, for example, comprise a first logarithmic amplifier for determining the logarithm of the current signal, and a second logarithm amplifier for determining the logarithm of the voltage signal. The logarithms may then be added using conventional gain stage op amps to determine the product thereof and to, thereby, generate a "power signal." It can be appreciated that the voltage level of the power signal is proportional to the power consumed on the primary side of the transformer 36. Because the multiplier 16 is well known to those skilled in the art, it will not be described in further detail.

The proportional voltage-to-frequency converter 18 is connected for receiving the power signal output from the multiplier 16. The converter 18 is also connected via a resistor 62 to +12 volts $V_{CC}$, from the primary side of the transformer 36, and via a capacitor 64 to the line 28b, for reasons described below. The converter 18 generates onto a line 66 a "primary energy signal," so designated because it is on the primary side of the transformer 36, having a frequency directly proportional to the voltage level of the power signal received from the multiplier 16. Because proportional voltage-to-frequency converters are well known to those skilled in the art, the converter 18 will not be described in detail. It can be appreciated, though, that the primary energy signal will comprise a series of low voltage levels, effective as low voltage pulses, wherein each pulse is indicative that a predetermined quantity of energy has been consumed on the primary side of the transformer 36. The predetermined quantity of energy may, for example, be a joule or, preferably, a kilojoule of energy. The length of the low voltage pulse relative to the period of a cycle, i.e., the duty cycle of the pulse, is a function of the capacitance of the capacitor 62 and the resistance of the resistor 64. It can be appreciated that the duty cycle may thus be set by the user or, optionally, if a default duty cycle such as 50% is acceptable, then the capacitor 62 and resistor 64 may be excluded from the present embodiment.

The line 66 is connected, via two serially connected resistors 68 and 70, to +12 volts $V_{CC}$ from the primary side of the power supply 12. A light emitting diode (LED) 72 is connected in parallel across the resistor 68. The LED 72 is optically coupled via the opto-coupler 20 for emitting light to a photosensitive base of a transistor 74. Because opto-couplers are well known in the art, the opto-coupler 20 will not be described in detail. The collector of the transistor 74 is connected via a resistor 76 to +12 volts $V_{CC}$ from the secondary side of the power supply 12. The emitter of the transistor 74 is connected for driving an interrupt on a microprocessor (not shown), such as a central processing unit (CPU), so that the energy consumed by the computer system may be monitored.

In operation, electrical power is received via the plug 22 into the power supply 12 and prepared for use by the computer system (not shown). Because the operation of the power supply 12 is well known in the art, it will not be described in further detail. It can be appreciated, though, that substantially all current consumed on the primary side of the transformer 36 passes through the current sense resistor 40. Because the voltage potential across the resistor 40 is the product of the resistance of the resistor and the current passing through it, the voltage sensed at the first end 40a of the resistor 40 is proportional to the current consumed on the primary side of the transformer 36. The op amp 14 amplifies the voltage sensed at the end 40a and generates the current signal to the multiplier 16. The line 58 supplies the voltage signal to the multiplier 16. The multiplier 16 then finds the analog product of the current and voltage signals and outputs the product, the power signal, onto the line 60 to the voltage-to-frequency converter 18. The converter 18 generates to the LED 72 of the opto-coupler 20 the primary energy signal, the frequency of which is directly proportional to the rate at which power is consumed by the primary side of the power supply 12. During low voltage pulses of the primary energy signal, current flows through the LED 72, thereby causing light to be emitted to the photosensitive base of the transistor 76. While the transistor 76 is activated, or turned on, a secondary energy signal pulse of current flows through the transistor to the microprocessor. Each secondary energy signal pulse indicates to the microprocessor that a specific quantity of energy has been consumed on the primary side of the power supply 12. The microprocessor can use the energy consumption information in any of a number of different ways, for example, to operate the computer system more efficiently.

FIG. 2 depicts the details of a system 110 for reporting consumed energy according to a second embodiment of the present invention. Since the system 110 contains many components that are identical to those of the previous embodiment, these components are referred to by the same reference numerals and will not be described in further detail.

As in the previous embodiment, the plug 22 is provided for receiving electrical power from a wall outlet (not shown). The rectifier circuit 26 is connected for delivering DC power onto the lines 28a and 28b. The serially connected bulk capacitors 30a and 30b and serially connected resistors 34a and 34b are connected across the lines 28a and 28b. The transformer 36, FET 38, and resistor 40 are also serially connected across the lines 28a and 28b. The PWM 44 is connected for receiving +12 volts $V_{CC}$ from the primary side of the power supply 12, for receiving feedback from the op amp 48, and for driving the gate 38c of the FET 38.

In the second embodiment, the line 58 is connected to a line 112 via a resistor 114 having a resistance of, for example, 1.6 MΩ. The inverting input terminal of the op amp 48 is connected to the line 112 via a 1 kΩ resistor 116 and a 10 kΩ resistor 118. The line 112 is connected to the line 28b via the resistor 116 and a 1 μF capacitor 120.

A conventional timer device 122 is provided for generating a pulse when a specific quantity of energy is consumed on the primary side of the transformer 36. While any of a number of different timer devices may be utilized to implement the timer 122, the eight-pin NE555 will be described herein for purposes of illustration. Since the NE555 is well known in the art, it will be not be described in detail except insofar as necessary to describe its operation in relation to the present invention.

The line 112 is connected to the timer device 122 via a pin 5, the frequency modulation pin of the timer device. The pin 5 is also grounded through a 10 kΩ resistor 123. A resistor 124 is connected between the pins 6 and 7, and a resistor 126 is connected between the pins 7 and 8 of the timer device 122, for purposes to be described. A capacitor 128 is connected to the pin 2 of the device 122 for accumulating a charge when a signal is input to the pin 5. The pin 3, the signal output pin of the timer device 112, is connected to the LED 72 of the opto-coupler 20.

In operation, a signal is input to the pin 5 from the voltage divider 34 and from the PWM 44. The capacitor 128 is charged through the pin 2 at a rate proportional to the strength and duration of the signal received on pin 5. It can be appreciated that, while the frequency of the pulses generated by the PWM 44 is relatively constant, the pulse width, or duty cycle of the pulse, is varied, or modulated, as needed to meet the power demands of the computer system connected thereto. Therefore, as more power is demanded, the pulse width of the signal generated by the PWM 44 is increased, and the capacitor 128 is charged more quickly.

After the capacitor 128 has acquired a charge equal to approximately ⅔ of its charge capacity, it begins to discharge, thereby causing a low voltage signal to be output on the normally high pin 3 to the LED 72 of the opto-coupler 20. The low voltage signal from the pin 3 permits current to flow through the LED 72 causing the LED to emit light. The emitted light is received by the photosensitive base of the transistor 74, thereby permitting current to flow to the computer microprocessor for monitoring the energy consumed by the computer system.

FIG. 3 is a flowchart of a method of determining and reporting consumed power embodying features of the present invention. In step 300, the voltage being consumed by the computer is sensed and the voltage signal indicative thereof is generated. In step 302, the current being consumed by the computer is sensed and the current signal indicative thereof is generated. In step 304, the amount of power being consumed by the computer is determined by multiplying the sensed voltage and current. In step 306, the consumed power is integrated over time to compute the energy being consumed by the computer. In step 308, when the energy consumed by the computer is equal to or exceeds a predetermined amount of energy, a primary energy signal pulse is generated.

It can be appreciated that the ratio of the duration of the low voltage signal on pin 3 to the duration of the normally high signal output from the pin 3 of the timer device 112, i.e., the duty cycle of the low signal, is proportional to the ratio of the resistance of the resistor 124 to the resistance of the resistor 126. For example, if the resistance of the resistor 124 is 1 kΩ, and the resistance of the resistor 126 is 100 kΩ, then the duration of the low voltage pulse portion of the signal will be 1/100th the duration of the normally high voltage portion of the signal.

It can be further appreciated that, as discussed in the previous embodiment, the frequency at which pulses are output from the pin 3 and from the transistor 74 is directly proportional to the rate at which power is consumed by the computer.

Alternatively, each pulse may be regarded as representing a specific quantity of energy that is consumed by the computer system.

It should be noted that each of the pulses generated in the preceding embodiments of the present invention consistently represents a predetermined fixed quantity of energy consumed by the computer system. The pulses may, accordingly, be used for a number of purposes such as, for example, comparing the relative energy efficiency of the computer system for various operations performed. If it is desired to know with substantial accuracy the exact quantity of energy that is consumed, then the frequency of the pulses may be calibrated. Such calibration maybe performed using a number of different techniques well known in the art. For example, an interrupt program may be utilized having a look-up table or an algorithm suited for calibrating the signal output from the transistor 74.

Both the first and second embodiments of the present invention have several advantages. For example, a relatively expensive microcontroller is not required to measure the energy consumed and to then generate to the CPU a bit stream indicative of the consumed energy. Therefore, the cost of implementing the present invention is significantly less than that of a system that utilizes such a microcontroller.

It is understood that several variations may be made in the foregoing without departing from the scope of the invention. For example, rather than using an opto-coupler to transmit signal pulses from the primary side to the secondary side of the transformer 36, a frequency modulator may be provided for changing, for one cycle, the frequency of the PWM 44. The altered frequency may then be detected by a phase lock loop (PLL) circuit on the secondary side of the transformer 36. Such a technique could also be implemented on supervisory silicon on the secondary side of the power supply, thereby further reducing the costs of implementing the present invention. As a further variation, the embodiments described herein could be readily implemented with systems other than computer systems. It is understood, too, that ratings suggested herein for resistors, capacitors, and the like may be varied depending on particular design parameters.

Although illustrative embodiments of the invention have been shown and described, a wide range of modification, change, and substitution is contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. In a computer system having a microprocessor, a switching power supply, and power supply lines for supplying power to the switching power supply, a method for determining and reporting the energy consumed by the computer system, comprising the steps of:

sensing a voltage across the power supply lines and generating a voltage signal indicative of the sensed voltage;

sensing a current passing through the power supply lines and generating a current signal indicative of the sensed current;

generating a power signal indicative of a product of the voltage and current signals, the power signal being indicative of an amount of power consumed by the computer system;

processing the power signal and generating an energy signal having a frequency directly proportional to a rate at which power is consumed by a primary side of the power supply;

conducting current to an LED during low voltage pulses of the energy signal causing light to be emitted to activate a photosensitive base of a transistor; and conducting another energy signal through the transistor to the microprocessor for indicating to the microprocessor that a specific quantity of energy has been consumed on the primary side of the power supply.

2. The method of claim 1 wherein the step of sensing a current comprises sensing a voltage at one end of a resistor connected in series with one of the power supply lines.

3. The method of claim 1 wherein the step of sensing a voltage comprises sensing a voltage using a voltage divider connected across the power supply lines.

4. The method of claim 1 further comprising amplifying the generated voltage signal prior to the step of generating a power signal indicative of a product of the voltage and current signals.

5. The method of claim 1 wherein the step of processing the power signal comprises generating a first signal indicative of the logarithm of the voltage signal, generating a second signal indicative of the logarithm of the voltage signal, and summing the first and second signals.

* * * * *